(12) United States Patent
Min et al.

(10) Patent No.: US 10,672,961 B2
(45) Date of Patent: Jun. 2, 2020

(54) LIGHT-EMITTING ELEMENT PACKAGE HAVING LEAD FRAME WITH CONNECTION PORTION

(71) Applicant: LG INNOTEK CO., LTD., Seoul (KR)

(72) Inventors: Byeong Hwang Min, Seoul (KR); Gam Gon Kim, Seoul (KR); Bong Kul Min, Seoul (KR); Byeong Duck Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/074,024

(22) PCT Filed: Feb. 3, 2017

(86) PCT No.: PCT/KR2017/001207
§ 371 (c)(1),
(2) Date: Jul. 30, 2018

(87) PCT Pub. No.: WO2017/135744
PCT Pub. Date: Aug. 10, 2017

(65) Prior Publication Data
US 2019/0044041 A1    Feb. 7, 2019

(30) Foreign Application Priority Data

Feb. 5, 2016   (KR) ........................ 10-2016-0014709

(51) Int. Cl.
*H01L 33/62*   (2010.01)
*H01L 33/48*   (2010.01)
(52) U.S. Cl.
CPC ............ *H01L 33/62* (2013.01); *H01L 33/486* (2013.01); *H01L 2224/48247* (2013.01);
(Continued)

(58) Field of Classification Search
CPC combination set(s) only.
See application file for complete search history.

(56) References Cited

U.S. PATENT DOCUMENTS 7,963,674 B2    6/2011  Takekuma et al.
2005/0242424 A1  11/2005  Isokawa
(Continued)

FOREIGN PATENT DOCUMENTS

JP    2003-338640 A    11/2003
JP    2013-58573 A     3/2013
(Continued)

OTHER PUBLICATIONS

International Search Report for PCT/KR2017/001207 (PCT/ISA/210) dated May 11, 2017.

*Primary Examiner* — Nduka E Ojeh
(74) *Attorney, Agent, or Firm* — Birch, Stewart, Kolasch & Birch, LLP

(57) ABSTRACT

A light-emitting element package includes a package body having a cavity; a first lead frame and a second lead frame disposed on the package body; a light-emitting element disposed on the bottom surface of the cavity and electrically connected to the first lead frame and the second lead frame; and a molding part surrounding the light-emitting element and disposed in at least a portion of the cavity. Each of the lead frames includes a first part corresponding to a portion of the bottom surface and side walls of the cavity; a second part corresponding to a portion of an upper surface and outer side surfaces of the package body; and a connection part disposed between the first part and the second part width of the connection part is narrower than the width of the first part and the second part in a region adjacent to the connection part.

4 Claims, 6 Drawing Sheets

(52) U.S. Cl.
CPC ............... *H01L 2224/48257* (2013.01); *H01L 2224/49107* (2013.01); *H01L 2924/181* (2013.01)

(56) References Cited

U.S. PATENT DOCUMENTS

| | | | |
|---|---|---|---|
| 2010/0117099 A1 | 5/2010 | Leung | |
| 2010/0163918 A1* | 7/2010 | Kim | H01L 25/0753 257/99 |
| 2010/0270571 A1* | 10/2010 | Seo | H01L 33/486 257/98 |
| 2012/0132937 A1* | 5/2012 | Chan | H01L 25/0753 257/89 |
| 2012/0235287 A1* | 9/2012 | Karim | H01L 33/486 257/676 |
| 2013/0107548 A1* | 5/2013 | Kim | H01L 33/62 362/373 |
| 2013/0335975 A1* | 12/2013 | Park | F21V 13/08 362/297 |

FOREIGN PATENT DOCUMENTS

| | | |
|---|---|---|
| KR | 10-2007-0098192 A | 10/2007 |
| KR | 10-0765241 B1 | 10/2007 |
| KR | 10-2009-0055659 A | 6/2009 |
| KR | 10-2013-0068725 A | 6/2013 |

\* cited by examiner

[Fig. 1]
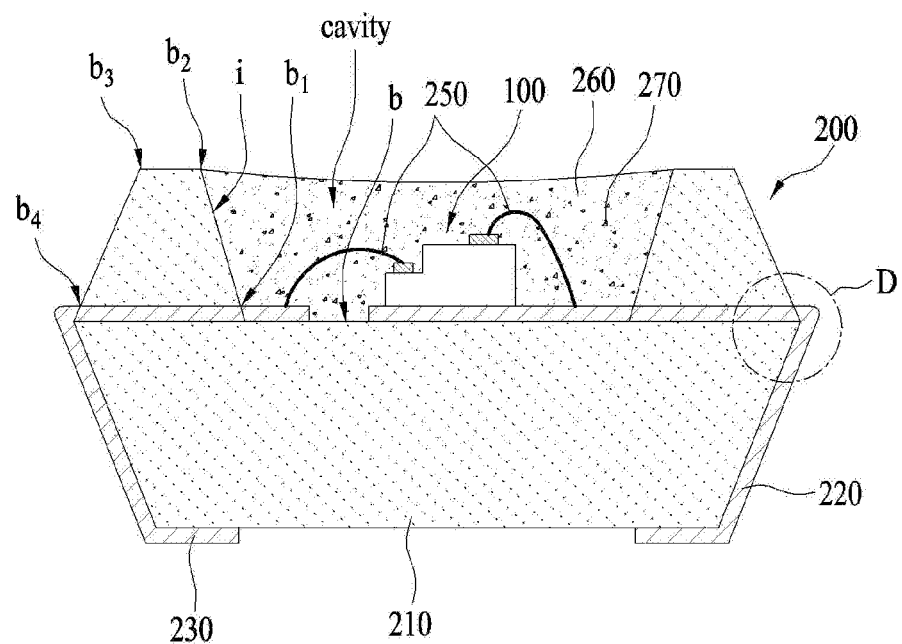
[Fig. 2]
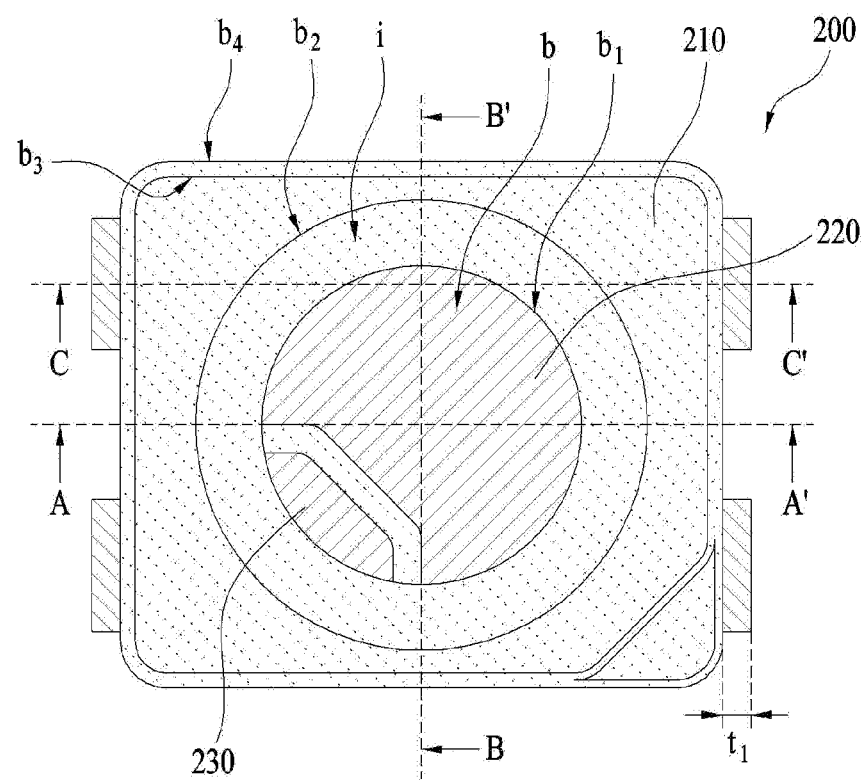

[Fig. 3]
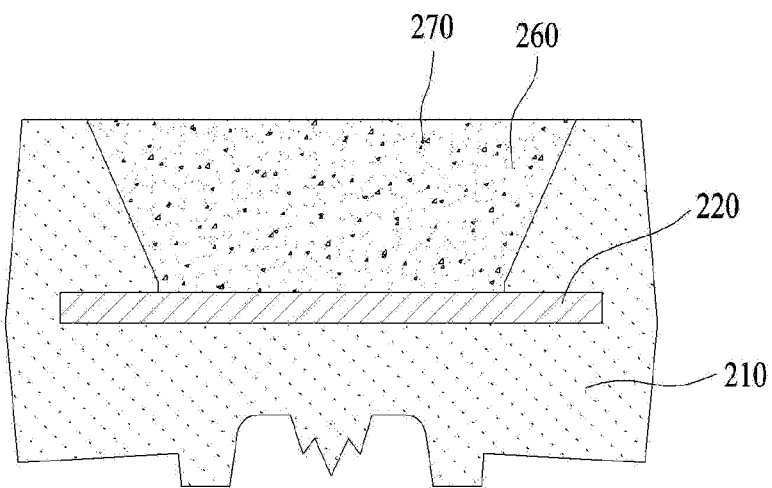
[Fig. 4]
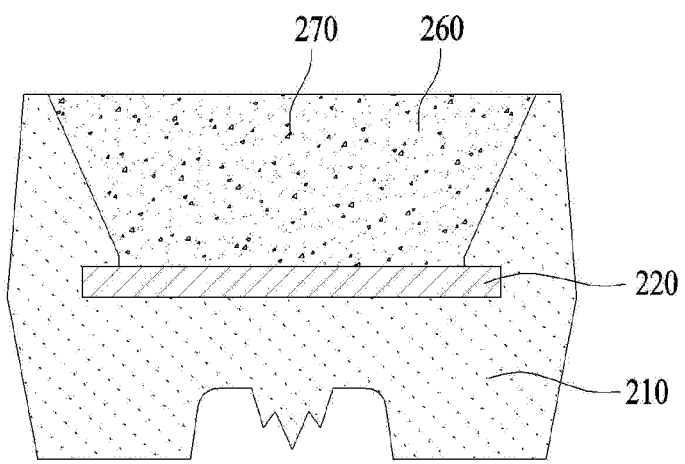

[Fig. 5]
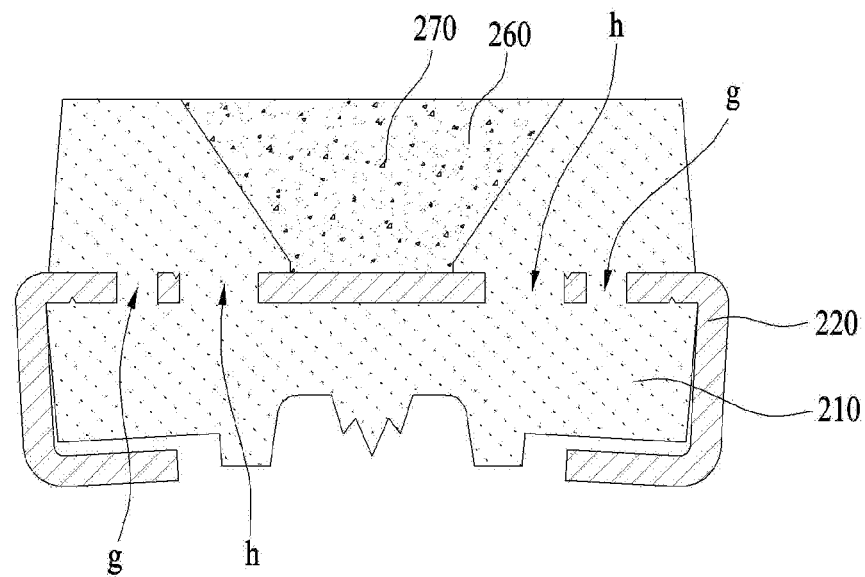
[Fig. 6]
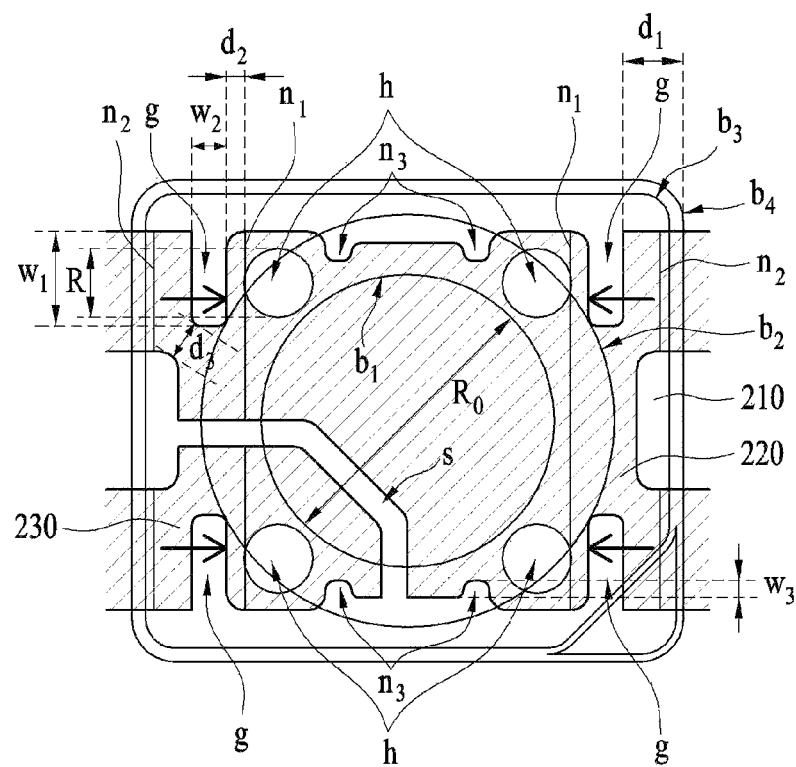

[Fig. 7]
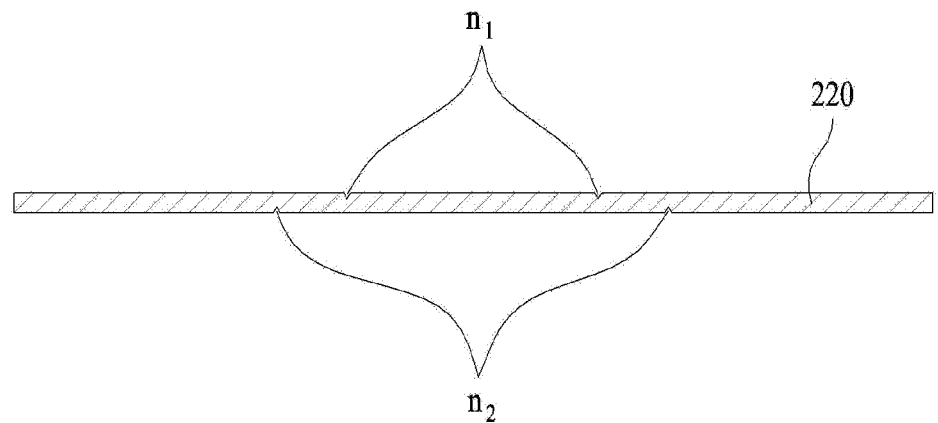
[Fig. 8a]
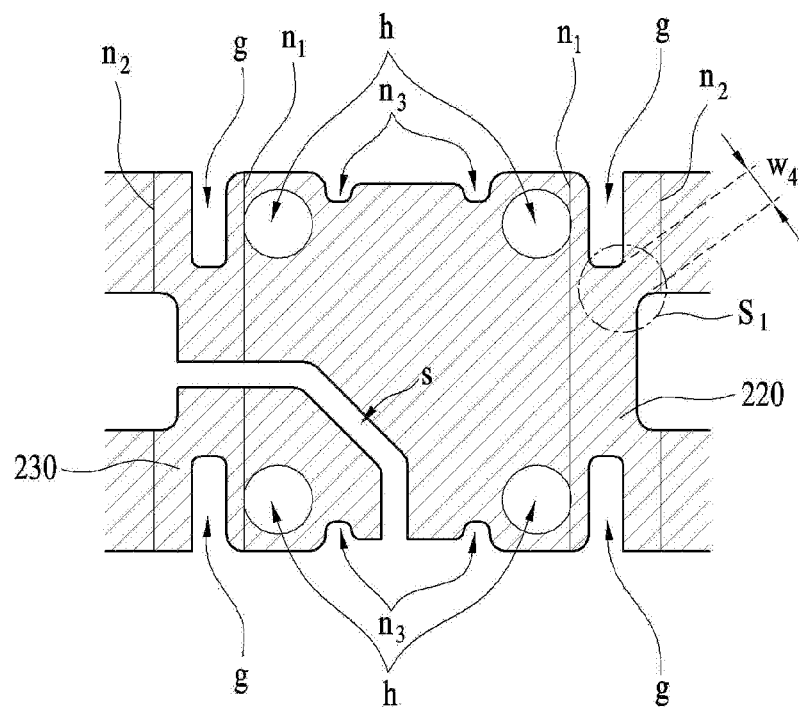

[Fig. 8b]
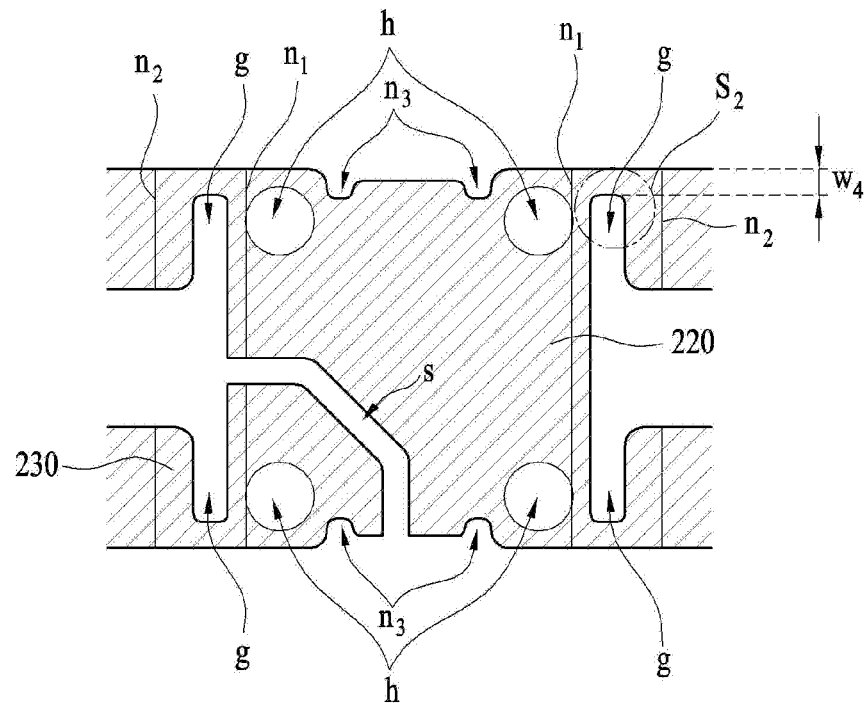
[Fig. 8c]
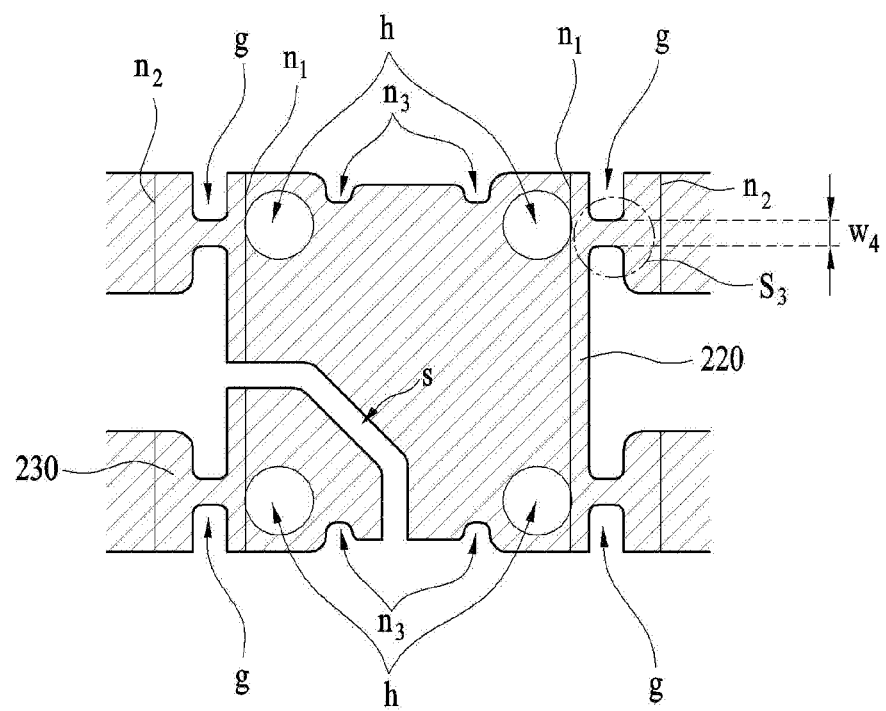

[Fig. 9]
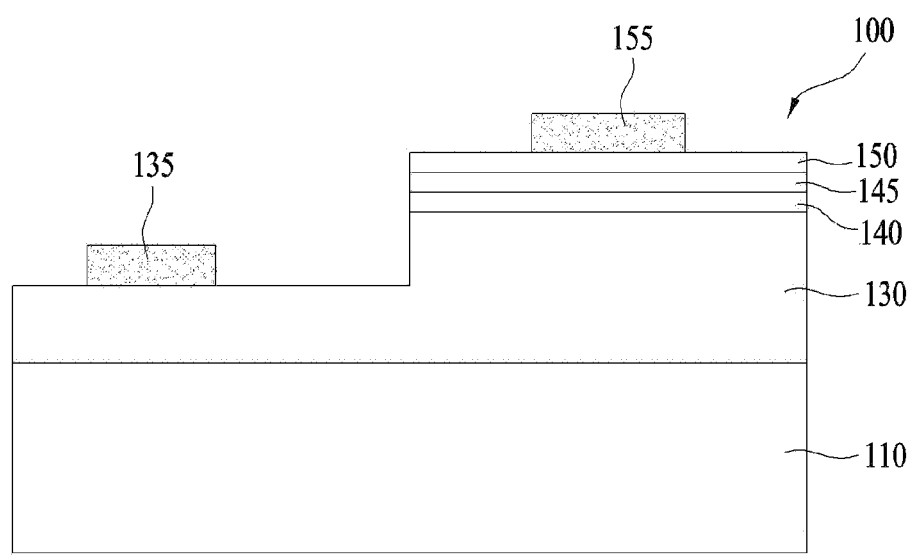

LIGHT-EMITTING ELEMENT PACKAGE HAVING LEAD FRAME WITH CONNECTION PORTION

TECHNICAL FIELD

Embodiments relate to a light-emitting device package, and more particularly, to a light-emitting device package having improved sealing performance by strengthening coupling of lead frames thereto.

BACKGROUND ART

Light-emitting devices, such as light-emitting diodes and laser diodes, which use a Group III-V or Group II-VI compound semiconductor material, are capable of rendering various colors, such as red, green, blue, and ultraviolet, by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared to conventional light sources, such as fluorescent lamps and incandescent lamps.

Therefore, such light-emitting devices are increasingly applied to transmission modules of optical communication units, light-emitting diode backlights as a replacement for cold cathode fluorescent lamps (CCFLs) constituting backlights of liquid crystal display (LCD) devices, lighting apparatuses using white light-emitting diodes as a replacement for fluorescent lamps or incandescent lamps, headlights for vehicles, and traffic lights.

A light-emitting device is configured such that a light-emitting structure, including a first conductive semiconductor layer, an active layer and a second conductive semiconductor layer, is disposed on a substrate and such that a first electrode and a second electrode are respectively disposed on the first conductive semiconductor layer and the second conductive semiconductor layer. Electrons injected through the first conductive semiconductor layer and holes injected through the second conductive semiconductor layer meet each other to emit light having energy determined by the inherent energy band of a constituent material of the active layer.

A light-emitting device package may be configured such that a light-emitting device is electrically connected with a pair of lead frames on a package body. When the lead frames are secured to the package body, bending portions may be formed.

The bending portions may cause separation of the lead frames from the package body. If the package body and the lead frames are separated from each other, moisture or other foreign substances may permeate a gap therebetween, leading to deterioration in sealing performance of the light-emitting device package.

DISCLOSURE

Technical Problem

Embodiments provide a light-emitting device package having improved sealing performance.

Technical Solution

An embodiment provides a light-emitting device package including a package body including a cavity, a first lead frame and a second lead frame disposed on the package body, a light-emitting device disposed in the lower surface of the cavity, the light-emitting device being electrically connected to the first lead frame and the second lead frame, and a molding portion enveloping the light-emitting device, the molding portion being disposed in at least a portion of the cavity, wherein each of the first lead frame and the second lead frame includes a first portion that corresponds to a portion of the lower surface and a portion of the sidewall of the cavity, a second portion that corresponds to a portion of the top surface and a portion of the outer side surface of the package body, and a connection portion that is disposed between the first portion and the second portion, the connection portion having a width that is smaller than the width of the first portion and smaller than the width of the second portion within a region adjacent to the connection portion.

The width of the connection portion may be equal to or greater than the width of the first lead frame or the second lead frame.

The width of the connection portion may be equal to or greater than 0.1 mm.

Each of the first lead frame and the second lead frame may include a through-hole formed in the first portion thereof, and the package body may be disposed in the through-hole.

The diameter of the through-hole may be greater than the width of the connection portion.

The through-hole may face the sidewall of the cavity and the top surface of the package body in the vertical direction.

The light-emitting device package may further include a first recess formed in at least one of the first lead frame and the second lead frame within an outside region of the connection portion.

The first recess may face the top surface of the package body in the vertical direction.

The light-emitting device package may further include a second recess formed in at least one of the first lead frame and the second lead frame within an inside region of the connection portion.

The second recess may face the top surface of the package body and the sidewall of the cavity in the vertical direction.

The light-emitting device package may further include a third recess formed in at least one of the first lead frame and the second lead frame within the through-hole.

The light-emitting device package may further include grooves formed in at least one of the first lead frame and the second lead frame within an outside region of the through-hole.

The grooves may face the top surface of the package body in the vertical direction.

The width of each of the grooves in the upward-and-downward direction may be greater than the diameter of the through-hole, and the width of each of the grooves in the lateral direction may be less than the diameter of the through-hole.

Advantageous Effects

In the light-emitting device package according to the embodiment, each of the first lead frame and the second lead frame has a connection portion having a relatively small width, which is formed adjacent to a region that is to be bent along the side surface of the package body, and accordingly it may be possible to prevent the first lead frame and the second lead frame from being detached from the package body due to stress attributable to bending.

In addition, during the process of manufacturing the light-emitting device package, a constituent material of the package body is introduced into holes and grooves and is sintered or cured, thereby strengthening the coupling between the package body and the first and second lead frames.

DESCRIPTION OF DRAWINGS

FIG. 1 is a view schematically illustrating an embodiment of a light-emitting device package;

FIG. 2 is a plan view of the embodiment of the light-emitting device package;

FIG. 3 is a cross-sectional view taken in the direction A-A' in FIG. 2;

FIG. 4 is a cross-sectional view taken in the direction B-B' in FIG. 2;

FIG. 5 is a cross-sectional view taken in the direction C-C' in FIG. 2;

FIG. 6 is a view illustrating the first lead frame and the second lead frame of FIG. 2 in detail;

FIG. 7 is a side-sectional view of the first lead frame;

FIGS. 8a to 8c are views illustrating embodiments of the first lead frame and the second lead frame; and FIG. 9 is a view illustrating a light-emitting device in the light-emitting device package of FIG. 1.

BEST MODE

Hereinafter, embodiments will be described with reference to the accompanying drawings in order to concretely realize the objects as set forth above.

It will be understood that when an element is referred to as being "on" or "under" another element, it can be directly on/under the element, or one or more intervening elements may also be present. When an element is referred to as being "on" or "under", "under the element" as well as "on the element" can be included based on the element.

FIG. 1 is a view schematically illustrating an embodiment of a light-emitting device package.

A light-emitting device package 200 according to the embodiment includes a package body 210, a first lead frame 220, a second lead frame 230, and a light-emitting device 100.

The package body 210 may be formed of an insulating material, which includes, for example, polyphthalamide (PPA) resin or a silicon-based material. The package body 210 may be provided with a cavity, and the cavity may have an open upper surface.

The cavity has a lower surface b and a sidewall i. A portion of the first lead frame 220 and a portion of the second lead frame 230, located on the package body 210, may be exposed through the lower surface b. The package body 210 may be exposed through the sidewall i. Here, the sidewall i refers to the inner sidewall of the cavity.

The light-emitting device 100 may be implemented as, for example, a light-emitting diode. Although the light-emitting device 100 is illustrated as being a horizontal-type light-emitting device, a vertical-type light-emitting device or a flip-bonded light-emitting device may alternatively be used.

In the case in which the light-emitting device 100 is a horizontal-type light-emitting device such as that illustrated in the drawings, the light-emitting device 100 may be electrically connected to the first lead frame 220 and the second lead frame 230 via wires 250.

The cavity may be filled with a molding portion 260 to protect the light-emitting device 100 and the wires 250. The molding portion 260 may include a fluorescent material 270. The fluorescent material 270 may be selected from the group consisting of a YAG-based fluorescent material, a nitride-based fluorescent material, silicate and combinations thereof. However, the disclosure is not limited thereto.

FIG. 1 illustrates a boundary b1 between the lower surface b of the cavity and the sidewall i of the cavity, a boundary b2 between the sidewall i of the cavity and the top surface of the package body 210, a boundary b3 between the top surface of the package body 210 and the outer sidewall of the package body 210, and a boundary b4 between the outer sidewall of the package body 210 and the edge of the package body 210. This will be explained in detail with reference to FIG. 2.

The first lead frame 220 and the second lead frame 230 may extend from the lower surface b of the cavity to a portion of the bottom surface of the package body 210 via the outer surface of the package body 210. Some regions of the first and second lead frames 220 and 230, which are indicted by 'D', may be bent. When the first lead frame 220 and the second lead frame 230, formed of copper (Cu) or the like, are bent, the regions of the first and second lead frames 220 and 230 that are close to the bent regions thereof may be subjected to stress.

Particularly, the stress that is applied to the regions at which the first lead frame 220 and the second lead frame 230 are coupled to the package body 210 may weaken the coupling between the package body 210 and the first and second lead frames 220 and 230.

FIG. 2 is a plan view of the embodiment of the light-emitting device package, FIG. 3 is a cross-sectional view taken in the direction A-A' in FIG. 2, FIG. 4 is a cross-sectional view taken in the direction B-B' in FIG. 2, and FIG. 5 is a cross-sectional view taken in the direction C-C' in FIG. 2. Here, the direction A-A' and the direction C-C' may be parallel to each other, and may be perpendicular to the direction B-B'.

Hereinafter, the positional relationship between the package body 210 and the first and second lead frames 220 and 230 will be described in detail with reference to FIGS. 2 to 5.

The first lead frame 220 and the second lead frame 230 may be partially exposed through the lower surface b of the cavity formed in the package body 210. Further, the first lead frame 220 and the second lead frame 230 protrude from both side surfaces of the package body 210 so as to be exposed to the outside. At this time, the first lead frame 220 and the second lead frame 230, which are located in the lower surface b of the cavity and located outside the package body 210, may be connected to each other at a region that is shielded by the package body 210 when viewed in FIG. 2. Here, the side surfaces of the package body 210 may refer to outer side surfaces of the package body 210, and this is the same in the following description.

In FIG. 2, the boundary b1 between the lower surface b of the cavity and the sidewall i of the cavity, the boundary b2 between the sidewall i of the cavity and the top surface of the package body 210 and the boundary b3 between the top surface of the package body 210 and the outer sidewall of the package body 210 are illustrated as being lines. However, these boundaries are just regions at which the shape of the package body 210 is changed, and the actual boundaries are not clearly distinguished by lines.

The width t1 by which the first lead frame 220 or the second lead frame 230 protrudes to the outside of the package body 210 may be equal to the thickness of the first lead frame 220 or the second lead frame 230, which may range from several tens of micrometers to several hundreds of micrometers. If the width t1 is too small, the first lead frame 220 or the second lead frame 230 may be broken due to the stress attributable to the bending. If the width t1 is too large, it may be difficult to perform the bending, or the region of the first lead frame 220 or the second lead frame 230, which is indicated by 'D' in FIG. 1, may be detached from the package body 210 due to the stress attributable to the bending.

As shown in FIG. 3, which illustrates the cross-section cut in the direction A-A' in FIG. 2, the first lead frame 220 is inserted into the package body 210 without being exposed to the outside of the package body 210. As shown in FIG. 4, which illustrates the cross-section cut in the direction B-B' in FIG. 3, the first lead frame 220 is inserted into the package body 210 without being exposed to the outside of the package body 210. At this time, the shape of the cavity in the direction A-A' in FIG. 2 and the shape of the cavity in the direction B-B' in FIG. 2 may be different from each other.

As shown in FIG. 5, which illustrates the cross-section cut in the direction C-C' in FIG. 2, a portion of the first lead frame 220 is inserted into the package body 210, and the remaining portion of the first lead frame 220 is bent and extends to the bottom surface of the package body 210 via the side surfaces of the package body 210.

In addition, as described below, the first lead frame 220 may include a pair of grooves g and a pair of holes h, which are formed in the left and right sides of the lower surface of the cavity. The grooves g may be formed symmetrically to each other about the lower surface of the cavity, and the holes g may also be formed symmetrically to each other about the lower surface of the cavity.

The holes h may be formed at positions further inward than the grooves g. A constituent material of the package body 210 may be introduced into the holes h and the grooves g. The holes h may be formed so as to penetrate the first lead frame 220 and the second lead frame 230, whereas the grooves g may be formed such that one surface of each of the first lead frame 220 and the second lead frame 230 is depressed. That is, the cross-section of each of the holes h in the horizontal direction may have a closed-curve shape, whereas the cross-section of each of the grooves g in the horizontal direction may have a shape that is open in one direction.

FIG. 6 is a view concretely illustrating the first lead frame and the second lead frame shown in FIG. 2, and FIG. 7 is a side-sectional view of the first lead frame. Hereinafter, with reference to FIGS. 6 and 7, the boundary b1 between the lower surface b of the cavity and the sidewall i of the cavity, the boundary b2 between the sidewall i of the cavity and the top surface of the package body, the boundary b3 between the top surface of the package body and the outer sidewall of the package body and the boundary b4 between the outer sidewall of the package body and the edge of the package body, which are shown in FIG. 1, will be described based on the positional relationship between the first lead frame 220 and the second lead frame 230.

The first lead frame 220 may extend along the lower surface and sidewall of the cavity and both side surfaces of the package body 210. The second lead frame 230 may extend from a certain region of the lower surface of the cavity to one side surface of the package body 210 via the sidewall of the cavity.

When the region of each of the first lead frame 220 and the second lead frame 230 that corresponds to a portion of the lower surface and a portion of the sidewall of the cavity is referred to as a first portion and the region thereof that corresponds to a portion of the top surface and a portion of the side surface of the package body 210 is referred to as a second portion, the region that is defined so as to have a relatively small width between the first portion of each of the first lead frame 220 and the second lead frame 230 and the second portion thereof may be referred to as a connection portion. This will be described later with reference to FIGS. 8a to 8c.

The first lead frame 220 and the second lead frame 230 are arranged on the lower surface of the cavity, with a gap s formed therebetween. The gap s is formed so as to have a constant width between the first lead frame 220 and the second lead frame 230. However, the disclosure is not limited thereto. As illustrated, the cross-sectional area of the region of the first lead frame 220 that corresponds to the lower surface of the cavity may be greater than the cross-sectional area of the region of the second lead frame 230 that corresponds to the lower surface of the cavity.

The first lead frame 220 and the second lead frame 230 are also disposed on the region that corresponds to the sidewall of the cavity. The cross-sectional area of the region of the first lead frame 220 that corresponds to the sidewall of the cavity may be greater than the cross-sectional area of the region of the second lead frame 230 that corresponds to the sidewall of the cavity.

The first lead frame 220 has therein three holes h, and the second lead frame 230 has therein one hole h. Each of the holes h may be formed in a through-hole shape, into which a constituent material of the package body may be introduced, as described above.

Each of the holes h may be formed so as to correspond to the sidewall of the cavity and the top surface of the package body 210. That is, each of the holes h may correspond to the boundary b2 between the sidewall of the cavity and the top surface of the package body 210. At this time, the cross-sectional area of the region of the hole h that corresponds to the top surface of the package body 210 may be less than the cross-sectional area of the region of the hole h that corresponds to the sidewall of the cavity.

The first lead frame 220 may have three grooves g formed in the region thereof that corresponds to the top surface of the package body 210, and the second lead frame 230 may have one groove g formed in the region thereof that corresponds to the top surface of the package body 210. Each of the grooves g may be open in the outward direction of the package body when viewed in FIG. 6, and a constituent material of the package body 210 may be introduced into the open region. When viewed in FIG. 6, the width w1 of the groove g in the vertical direction may be greater than the diameter R of the hole h, and the width w2 of the groove g in the horizontal direction may be greater than the diameter of the hole h.

A portion of the groove g corresponds to the boundary b2 between the sidewall i of the cavity and the top surface of the package body. However, the disclosure is not limited thereto.

A first recess n1 is formed between the hole h and the groove g. As shown in FIG. 7, a V-shaped recess is formed in the top surface of the first lead frame 220 or the second lead frame 230. The first recess n1 may serve to alleviate the stress that is applied to a portion of the first lead frame 220 or the second lead frame 230 that is located on the center region of the package body when the first lead frame 220 or the second lead frame 230 is bent.

The first lead frame 220 may have three third recesses n3 formed in regions thereof that are located further inward than the holes h therein, and the second lead frame 230 may have one third recess n3 formed in a region thereof that is located further inward than the hole h therein. The above-described first recess n1 and a second recess n2 to be described below are formed in the light-emitting device package 200 in the vertical direction when viewed in FIG. 1, whereas the third recess n3 is formed in the upward-and-downward direction when viewed in FIG. 6.

When viewed in FIG. 6, each third recess n3 may be open in the outward direction of the package body, and a constituent material of the package body may be introduced into the open region. The above-described third recess n3 may be formed so as to correspond to the sidewall of the cavity.

A second recess n2 may be formed in a portion of the first lead frame 220 or the second lead frame 230 that is located on the top surface of the package body. The second recess n2 may be located adjacent to the boundary b3 between the top surface of the package body and the outer sidewall of the package body. Referring to FIG. 7, the second recess n2 may be formed so as to have a V-shape in the bottom surface of the first lead frame 220 or the second lead frame 230.

In the left region of FIG. 6, the first recess n1 and the second recess n2, formed in each of the first lead frame 220 and the second lead frame 230, are spaced apart from each other. However, the first recess n1 and the second recess n2 may be arranged on a straight line.

When the first lead frame 220 and the second lead frame 230 are bent in the outside region of the boundary b4 between the outer sidewall of the package body and the edge of the package body in the lateral direction of the package body, stress may be applied in the direction indicated by the arrows. At this time, the groove g may reduce the stress that is applied to the first lead frame 220 and the second lead frame 230 toward the sidewall and the lower surface of the cavity, thereby preventing the first lead frame 220 and the second lead frame 230 from being deformed or from being detached from the package body.

Each of the first to third recesses n1 to n3 does not necessarily have a geometrically V-shaped cross-section, but the cross-section thereof may approximate a V-shape, rather than a U-shape, which is the cross-sectional shape of the groove g.

In FIG. 6, the distance d1 from the edge of the groove g to the boundary b4 between the outer sidewall of the package body 210 and the edge of the package body 210 may be equal to or greater than 0.1 mm. If the distance d1 is less than 0.1 mm, the lead frame may be deformed when being bent, or the coupling strength between the circuit board and the light-emitting device package may be weakened when the light-emitting device package is secured to a circuit board.

In FIG. 6, the distance d2 between the groove g and the hole h may be equal to or greater than 0.1 mm. If the distance d2 is less than 0.1 mm, the position of the hole h may not be accurately controlled, and the strength of the lead frame may be weakened in the region between the hole h and the groove g.

In FIG. 6, the width d3 of the connection portion of the lead frame, which is located adjacent to the groove g, may be equal to or greater than the thickness of the lead frame. When the lead frame is manufactured through a pressing process, if the width d3 of the connection portion of the lead frame is less than the thickness of the lead frame, the connection portion may be broken.

In addition, in FIG. 6, the diameter W of the hole h may be equal to or less than 35% of the diameter R0 of the lower surface of the cavity. Here, the lower surface of the cavity may be an inside region of the boundary b1.

If the diameter W of the hole h exceeds 35% of the diameter R0 of the lower surface of the cavity, the hole h may reach the lower surface of the cavity, with the result that the area of the lower surface of the cavity may be reduced, and consequently the area for fixing the light-emitting device or wire bonding may be reduced.

FIGS. 8a to 8c are views illustrating embodiments of the first lead frame and the second lead frame. As shown in FIGS. 8a to 8c, the shapes of the grooves g formed in the first lead frame 220 and the second lead frame 230 in each embodiment are different from those in the other embodiments. Other configurations of the first lead frame 220 and the second lead frame 230 in each embodiment are the same as those in the other embodiments. The first lead frame 220 and the second lead frame 230 may be provided at the package body so as to form the light-emitting device package.

In FIGS. 8a to 8c, each of the regions represented by S1 to S3 may be referred to as a 'connection portion'. In the configurations of the first lead frame 220 and the second lead frame 230, described above with reference to FIG. 6, when the region corresponding to a portion of the lower surface and a portion of the sidewall of the cavity is referred to as a first portion and the region corresponding to a portion of the top surface and a portion of the side surface of the package body is referred to as a second portion, the region that is defined so as to have a relatively small width between the first portion of each of the first lead frame 220 and the second lead frame 230 and the second portion thereof may be referred to as a connection portion S1 to S3.

In FIG. 8a, the connection portion S1 may be open in the outward direction of the first lead frame 220 and the second lead frame 230, and a constituent material of the package body may be introduced into the open region.

In FIG. 8b, the connection portion S2 may be open in the inward direction of the first lead frame 220 and the second lead frame 230, and a constituent material of the package body may be introduced into the open region.

In FIG. 8c, the connection portion S3 may be open in the outward and inward directions of the first lead frame 220 and the second lead frame 230, and a constituent material of the package body may be introduced into the open region.

In FIGS. 8a to 8c, the width w4 of the connection portion S1 to S3 may be greater than 0.1 mm, for example.

When the first lead frame 220 and the second lead frame 230 are manufactured through a pressing process, the width w4 may be equal to or greater than the thickness of each of the first lead frame 220 and the second lead frame 230. If the width w4 is less than the thickness of each of the first lead frame 220 and the second lead frame 230, the connection portion may be broken when the first lead frame 220 and the second lead frame 230 are manufactured through a pressing process.

When manufactured through an etching process, the first lead frame 220 and the second lead frame 230 may be etched such that the width w4 becomes 0.1 mm or more, in consideration of a process margin.

The width w4 of the connection portion S1 to S3 may be less than the diameter R of the hole h formed in the first lead frame 220 and the second lead frame 230. When viewed in FIG. 6, the width w4 may be less than the width w1 of the groove g in the upward-and-downward direction and may be greater than the width w3 of the second recess n2 in the upward-and-downward direction.

In addition, the width w4 of the connection portion S1 to S3 may be less than the width of the region of each of the first lead frame 220 and the second lead frame 230 that is adjacent to the connection portion S1 to S3.

FIG. 9 is a view illustrating the light-emitting device in the light-emitting device package of FIG. 1.

The light-emitting device 100 may be configured such that a light-emitting structure, including a first conductive semiconductor layer 130, an active layer 140 and a second conductive semiconductor layer 150, is disposed on a substrate 110 and such that an electron-blocking layer 145 is disposed between the active layer 140 and the second conductive semiconductor layer 150.

The substrate 110 may be formed of a material suitable for semiconductor material growth or a carrier wafer. The substrate 110 may be formed of a highly thermally conductive material, and may include a conductive substrate or an insulating substrate. For example, at least one of sapphire ($Al_2O_3$), $SiO_2$, SiC, Si, GaAs, GaN, ZnO, GaP, InP, Ge, or $Ga_2O_3$ may be used for the substrate 110.

When the substrate 110 is formed of sapphire and when a light-emitting structure is grown on the substrate 110 using GaN or AlGaN, dislocation, melt-back, cracking, pitting, and surface morphology defects that deteriorate crystallization may occur due to great lattice mismatch between GaN or AlGaN and sapphire and a great difference between thermal expansion coefficients thereof. For this reason, a buffer layer (not shown) may be grown using, for example, AlN.

The first conductive semiconductor layer 130 may be formed of a compound semiconductor such as a group III-IV or II-V compound semiconductor, and may be doped with a first conductive dopant. When the first conductive semiconductor layer 130 is an n-type semiconductor layer, the first conductive dopant may include an n-type dopant such as Si, Ge, Sn, Se, and Te. The first conductive semiconductor layer 130 may be grown so as to have a single layer or multi-layer structure. However, the disclosure is not limited thereto.

The active layer 140 may include any one of a single-well structure, a multi-well structure, a single-quantum well structure, a multi-quantum well (MQW) structure, a quantum dot structure and a quantum wire structure.

The second conductive semiconductor layer 150 may be formed of a compound semiconductor such as a group III-IV or II-V compound semiconductor, and may be doped with a second conductive dopant. When the second conductive semiconductor layer 150 is a p-type semiconductor layer, the second conductive dopant may be a p-type dopant such as Mg, Zn, Ca, Sr, and Ba.

The electron-blocking layer 145 may be grown between the active layer 140 and the second conductive semiconductor layer 150. The electron-blocking layer 145 may be formed of a material having an energy band gap larger than that of the second conductive semiconductor layer 150. For example, the electron-blocking layer 145 may be formed of AlGaN.

Because the substrate 110 is insulative, in order to supply electric current to the first conductive semiconductor layer 130, the region from a light-transmitting conductive layer 160 to a portion of the first conductive semiconductor layer 130 may be mesa-etched so as to expose a portion of the first conductive semiconductor layer 130.

A first electrode 135 may be disposed on the exposed first conductive semiconductor layer 130, and a second electrode 155 may be disposed on the light-transmitting conductive layer 160.

The first electrode 135 and/or the second electrode 155 may be formed of a conductive material, for example, metal. Particularly, the first electrode 135 and/or the second electrode 155 may be formed of a material selected from the group consisting of Ag, Ni, Al, Rh, Pd, Ir, Ru, Mg, Zn, Pt, Au, Hf and combinations thereof, and may be formed so as to have a single layer or multi-layer structure.

In the above-described light-emitting device package, each of the first lead frame and the second lead frame has a connection portion having a relatively small width, which is formed adjacent to a region that is to be bent along the side surface of the package body, and accordingly it may be possible to prevent the first lead frame and the second lead frame from being detached from the package body due to stress attributable to bending. In addition, during the process of manufacturing the light-emitting device package, a constituent material of the package body is introduced into holes and grooves and is sintered or cured, thereby strengthening the coupling between the package body and the first and second lead frames.

While the disclosure has been particularly shown and described with reference to exemplary embodiments thereof, these embodiments are only proposed for illustrative purposes and do not restrict the disclosure, and it will be apparent to those skilled in the art that various changes in form and details may be made without departing from the essential characteristics of the embodiments set forth herein. For example, respective configurations set forth in the embodiments may be modified and applied. Further, differences in such modifications and applications should be construed as falling within the scope of the disclosure as defined by the appended claims.

INDUSTRIAL APPLICABILITY

The light-emitting device package as described above may be utilized as a light source of a lighting system. For example, the light-emitting device package may be used in a backlight unit of an image display apparatus or a lighting apparatus.

When used in the backlight unit of an image display apparatus, the light-emitting device package may be used in an edge-type backlight unit or a vertical-type backlight unit. When used in the lighting apparatus, the light-emitting device package may be used in a lamp-type or bulb-type light source, or may be utilized as a light source of a mobile terminal.

The invention claimed is:

1. A light-emitting device package comprising:
   a package body comprising a cavity;
   a first lead frame and a second lead frame disposed on the package body;
   a light-emitting device disposed in a lower surface of the cavity, the light-emitting device being electrically connected to the first lead frame and the second lead frame;
   a molding portion enveloping the light-emitting device, the molding portion being disposed in at least a portion of the cavity;
   a first recess formed in at least one of the first lead frame and the second lead frame and formed in a line shape in a second direction by recessing an upper surface of the at least one of the first lead frame and the second lead frame; and
   a second recess formed in at least one of the first lead frame and the second lead frame and formed in a line shape in the second direction by recessing a lower surface of the at least one of the first lead frame and the second lead frame,
   wherein each of the first lead frame and the second lead frame comprises a first portion that corresponds to a portion of the lower surface and a portion of a sidewall of the cavity, a second portion that corresponds to a portion of a top surface and a portion of an outer side surface of the package body, and a connection portion between the first portion and the second portion, wherein the first portion is spaced from the second portion in a first direction, each of the first portion and the second portion having a maximum width in the second direction, wherein the connection portion is connected to the first portion and connected to the second portion, wherein the connection portion has a width that is smaller than the maximum width of the first portion and smaller than the maximum width of the second portion, wherein each of the first lead frame and the second lead frame comprises a through-hole formed in the first portion thereof, and the package body is disposed in the through-hole, wherein a third recess is formed in at least one of the first lead frame and the second lead frame within the through-hole, wherein the width of the connection portion of the first and second lead frame is equal to or greater than a thickness of the first and second lead frame, wherein a horizontal cross section of the through hole is circular, wherein a diameter of the through hole is bigger than the width of the connection portion and a width of the first recess in the first direction, and wherein a length of the first recess in the second direction is greater than a length of the second recess in the second direction.

2. The light-emitting device package according to claim 1, wherein the through-hole faces the sidewall of the cavity and the top surface of the package body in a vertical direction.

3. The light-emitting device package according to claim 1, further comprising:

grooves formed in at least one of the first lead frame and the second lead frame within an outside region of the through-hole.

4. The light-emitting device package according to claim 3, wherein the grooves face the top surface of the package body in a vertical direction.

* * * * *